US006302704B1

(12) United States Patent
Belanger, Jr.

(10) Patent No.: US 6,302,704 B1
(45) Date of Patent: Oct. 16, 2001

(54) METHOD AND APPARATUS FOR SELECTIVELY CONNECTING FLEXIBLE CIRCUITS

(75) Inventor: Thomas Dudley Belanger, Jr., Saline, MI (US)

(73) Assignee: Ford Global Tech., Dearborn, MI (US)

( * ) Notice: Subject to any disclaimer, the term of this patent is extended or adjusted under 35 U.S.C. 154(b) by 0 days.

(21) Appl. No.: 09/298,240

(22) Filed: Apr. 22, 1999

(51) Int. Cl.[7] .............................. H01R 9/00; H05K 3/00; H05K 7/20
(52) U.S. Cl. .............................. 439/67; 439/79; 439/260; 29/844; 361/709
(58) Field of Search .................... 439/59–62, 67, 439/79, 80, 260; 29/844, 845; 361/704–711

(56) References Cited

U.S. PATENT DOCUMENTS

| | | |
|---|---|---|
| 3,665,370 | 5/1972 | Hartmann . |
| 3,725,843 | 4/1973 | Johnson . |
| 3,950,057 | 4/1976 | Calabro . |
| 4,548,451 | 10/1985 | Benarr et al. . |
| 4,834,660 | 5/1989 | Cotti . |
| 4,846,699 | 7/1989 | Glover et al. . |
| 5,059,129 | 10/1991 | Brodsky et al. . |
| 5,096,431 | 3/1992 | Byrne . |
| 5,099,393 | 3/1992 | Bentlage et al. . |
| 5,156,558 | 10/1992 | Belanger, Jr. . |
| 5,171,159 | 12/1992 | Byrne . |
| 5,288,141 | 2/1994 | Isshiki et al. . |
| 5,372,512 | * 12/1994 | Wilson et al. ........................ 439/67 |
| 5,409,384 | * 4/1995 | Green et al. ........................ 439/67 |
| 5,447,451 | 9/1995 | Bishop . |
| 5,479,110 | * 12/1995 | Crane et al. ........................ 439/67 X |
| 5,536,176 | 7/1996 | Borchew et al. . |
| 5,540,597 | 7/1996 | Budman et al. . |
| 5,555,490 | 9/1996 | Carroll . |
| 5,574,270 | 11/1996 | Steffen . |
| 5,594,627 | 1/1997 | Le . |
| 5,679,018 | 10/1997 | Lopata et al. . |
| 5,702,269 | * 12/1997 | Uchida ........................ 439/67 X |
| 5,703,760 | 12/1997 | Zhu . |
| 5,707,245 | 1/1998 | Yamamoto et al. . |
| 5,813,878 | 9/1998 | Kuwata et al. . |
| 5,947,764 | * 9/1999 | Pan et al. ........................ 439/67 X |
| 5,991,154 | * 11/1999 | Clemens et al. ................ 361/709 X |
| 6,075,208 | * 6/2000 | Persson ........................ 361/704 X |

\* cited by examiner

Primary Examiner—Stanley J. Witkowski
(74) Attorney, Agent, or Firm—Ford Global Tech.

(57) ABSTRACT

A method and an apparatus 10 for interconnecting automotive electrical circuits and components. In one embodiment, the apparatus 10 includes at least one channel 73 formed by an opposing pair of rails 66, and a backplane 20. The backplane includes an "omega-shaped" cavity 38. The assembly further includes a first flexible circuit 16 disposed within the backplane 20, an elastomeric member 22 residing upon the circuit 16, and a card 14 which is movably disposed within the rails 66 and which supports a second flexible circuit 30. The card 14 is movable between a first position which is remote from the cavity 38 and a second position in which portions of the card 14 and the second flexible circuit 30 penetrate the cavity 38, thereby deforming the elastomeric member 22 and securely and electrically connecting the first flexible circuit 16 to the second flexible circuit 30.

13 Claims, 8 Drawing Sheets

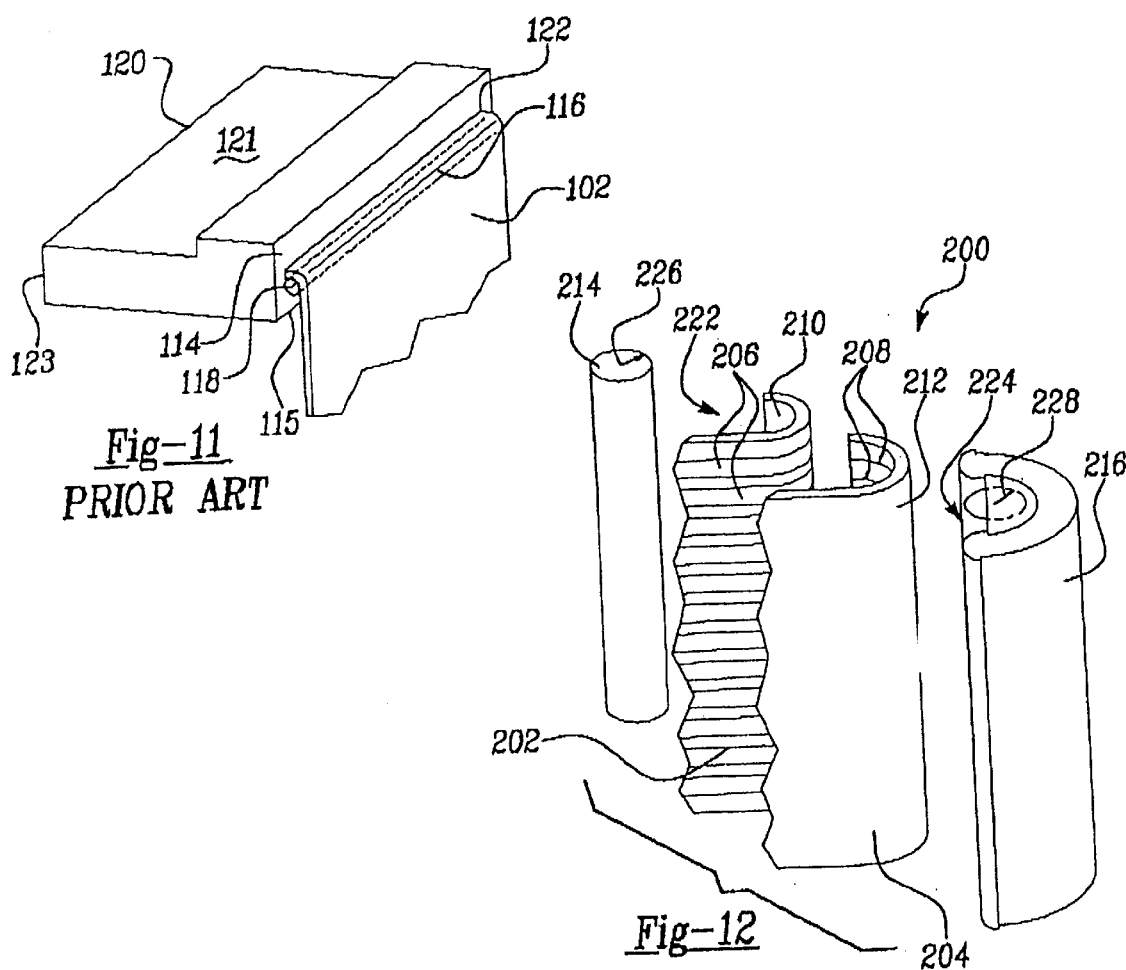
Fig-11
PRIOR ART
Fig-12
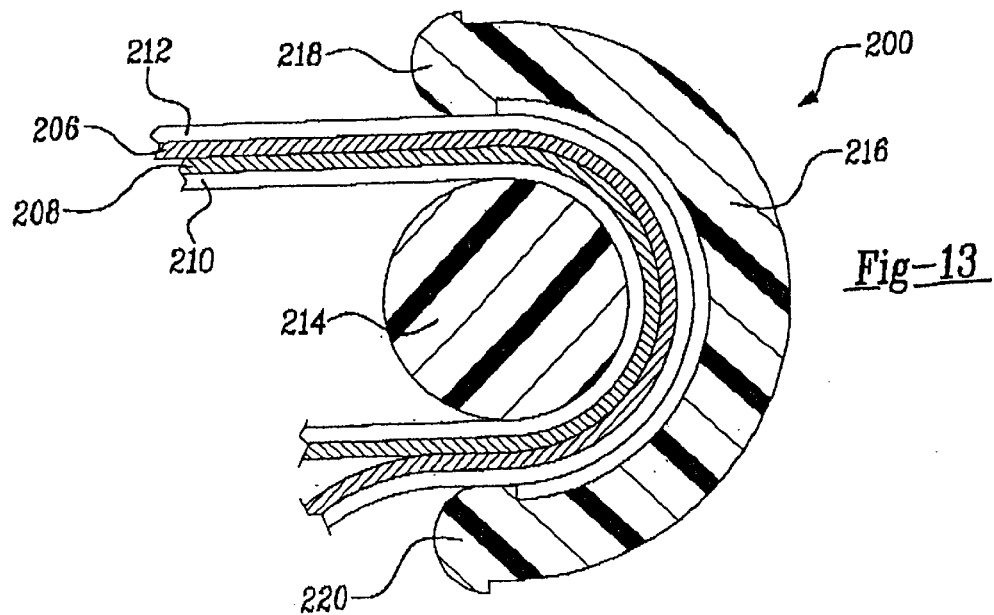
Fig-13

US 6,302,704 B1

METHOD AND APPARATUS FOR SELECTIVELY CONNECTING FLEXIBLE CIRCUITS

FIELD OF THE INVENTION

This invention generally relates to a method and to an apparatus for interconnecting electrical circuits and components and, more particularly, to a method and to an apparatus for selectively and electrically interconnecting automotive electrical circuits and components.

BACKGROUND OF THE INVENTION

Automobiles include a relatively large number of distributed electrical components and control modules (e.g., a cooperative and electrically coupled set of components) which must be selectively and electrically interconnected in order to allow the automobile to properly operate. Typically, this interconnection is achieved by the use of several selectively interconnected harnesses which traverse through various portions of the automobile, such as through the automobile instrument panel. Each harness typically contains a bundle of several insulated electrical conductors housed within an encapsulating protective cover. Selected wires within a single harness and/or selected wires within different harnesses are spliced and/or connected to various automobile components or modules, thereby cooperatively forming a desired automobile electrical interconnection network.

These networks suffer from several disadvantages. The harnesses are relatively bulky, thereby requiring a relatively large amount of mounting space and undesirably restricting the size of certain portions of the automobile, such as the air conditioning vents. The relatively bulky and encapsulated wire packaging makes the creation of these networks rather difficult and makes the detection, isolation, and correction of circuit faults very difficult. Furthermore, the splicing of the wires, necessary to create these desired interconnection networks, decreases the overall integrity of the interconnection circuit network, thereby increasing the probability of an undesirable electrical failure.

There is therefore a need for a circuit interconnection method and apparatus which overcomes the various previously delineated drawbacks of these prior harness arrangements and which allows for the relatively efficient, selective, and secure electrical and physical interconnection of automobile components and modules. Applicant's invention addresses these drawbacks and provides a new and useful apparatus and method for selectively making such desired electrical connections.

SUMMARY OF THE INVENTION

It is therefore a primary object of the present invention to provide a method and an apparatus for selectively creating automobile electrical connections in a manner which overcomes the previously delineated disadvantages of prior automotive electrical interconnection schemes and systems.

It is another object of the present invention to provide a method and apparatus for allowing automotive components and modules, such as those residing within the automobile's instrument panel, to be efficiently, selectively, and securely interconnected in a desired manner.

According to one aspect of the present invention, an electrical connector assembly is provided. Particularly, the assembly includes a backplane and at least one channel formed by an opposing pair of rails. The backplane includes a slotted aperture formed by the cooperative arrangement of a pair of opposed force plates and a support buttress member which cooperates with the force plates to form an "omega-shaped" cavity. The assembly further includes a first flexible circuit having a first conductive buss disposed upon the backplane, an elastomeric member residing upon the first flexible circuit, and a card which is movably disposed within the rails and which supports a second flexible circuit having a second conductive buss. The card is movable between a first position which is remote from the slotted aperture and a second position in which the second flexible circuit selectively penetrates the slotted aperture, thereby deforming the elastomeric member against the force plates, while securely and electrically connecting the first conductive buss to the second conductive buss.

According to another aspect of the present invention, a method for making an electrical connection between a first flexible circuit and a second flexible circuit is provided. Particularly, the method includes the steps of providing a base assembly having at least one channel formed by an opposing pair of rails, and a backplane having a cavity; placing an elastomeric member upon the first flexible circuit; disposing the first flexible circuit within the cavity; disposing the second flexible circuit upon a card; movably disposing the card within the rails; and moving the card between a first position which is remote from the cavity and a second position in which the second flexible circuit penetrates the cavity, thereby deforming the elastomeric member and securely and electrically mating with the first circuit.

Further objects, features, and advantages of the present invention will become apparent from a consideration of the following description and claims when taken in conjunction with the accompanying drawings.

BRIEF DESCRIPTION OF THE DRAWINGS

For a substantially fuller and more complete understanding of the nature and objects of the present invention, reference should be had to the following drawings in which:

FIG. 11 is a perspective view of a terminal shroud connector made in accordance with the teachings of the prior art;

FIG. 12 is a perspective un assembled view of a connector made in accordance with the teachings of an alternate embodiment of the present invention;

FIG. 13 is a top sectional assembled view of the connector shown in FIG. 12;

DETAILED DESCRIPTION OF THE PREFERRED EMBODIMENT OF THE INVENTION

Figure 1:
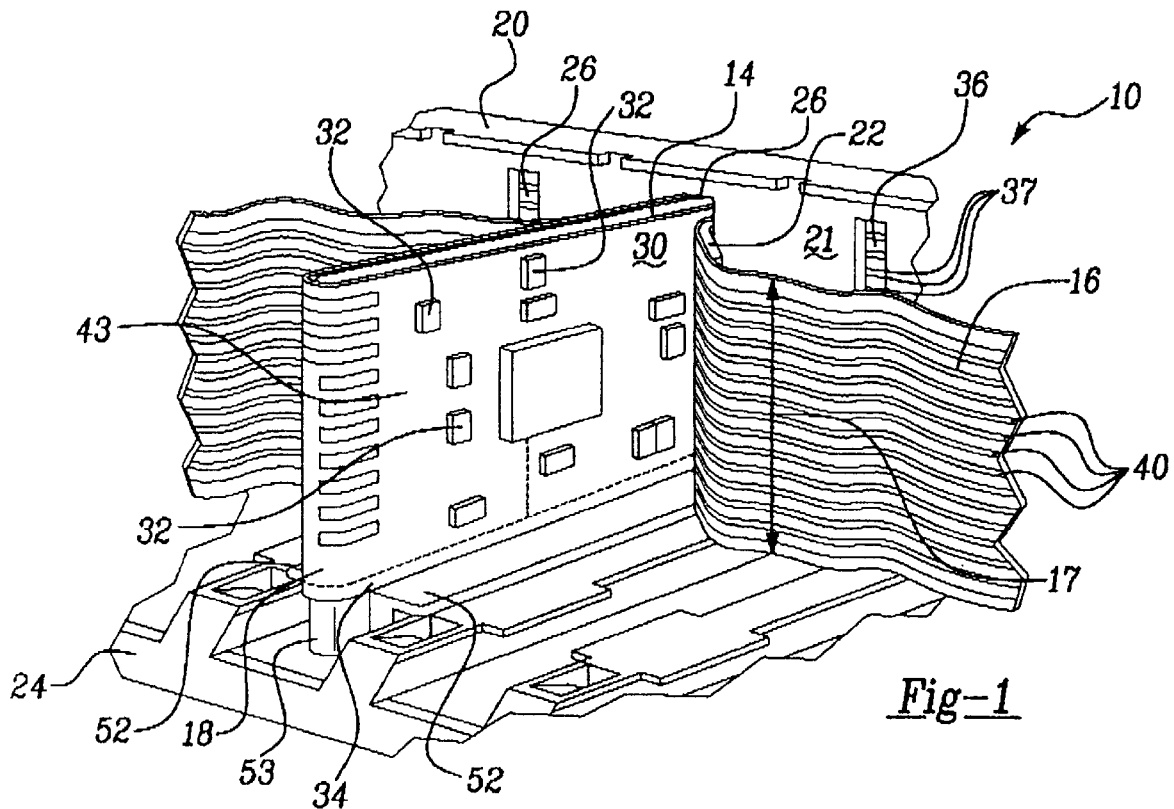
FIG. 1 is a perspective fragmented view of an electrical connector assembly made in accordance with the teachings of the present invention.
Figure 2:
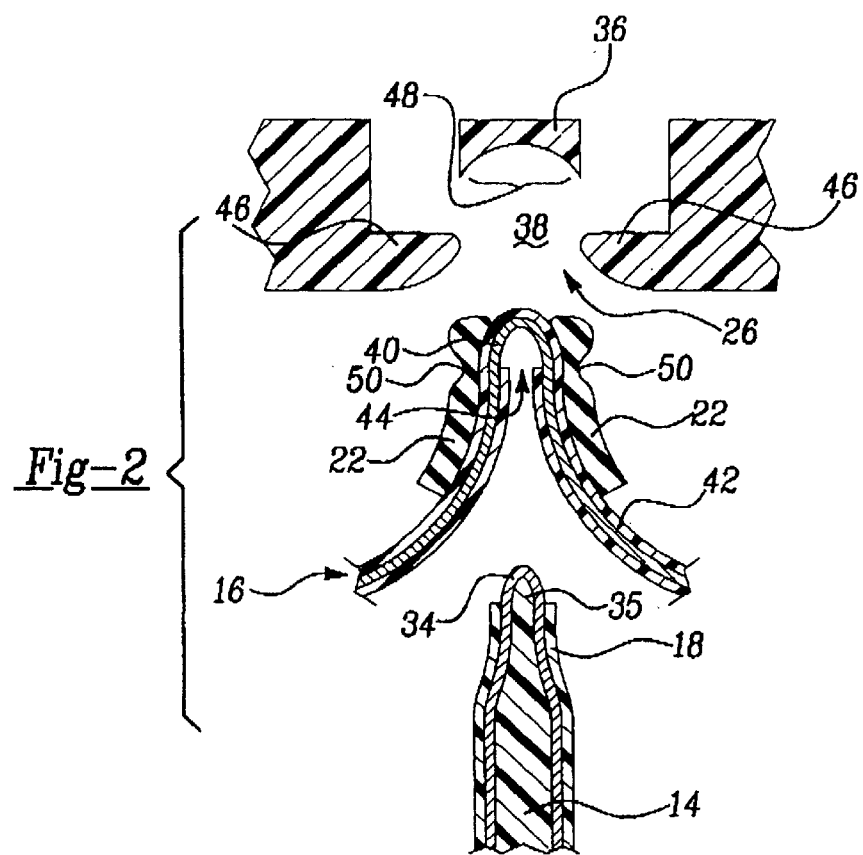
FIG. 2 is a top, sectional, and un assembled view of a portion of the assembly shown in FIG. 1.
Figure 3:
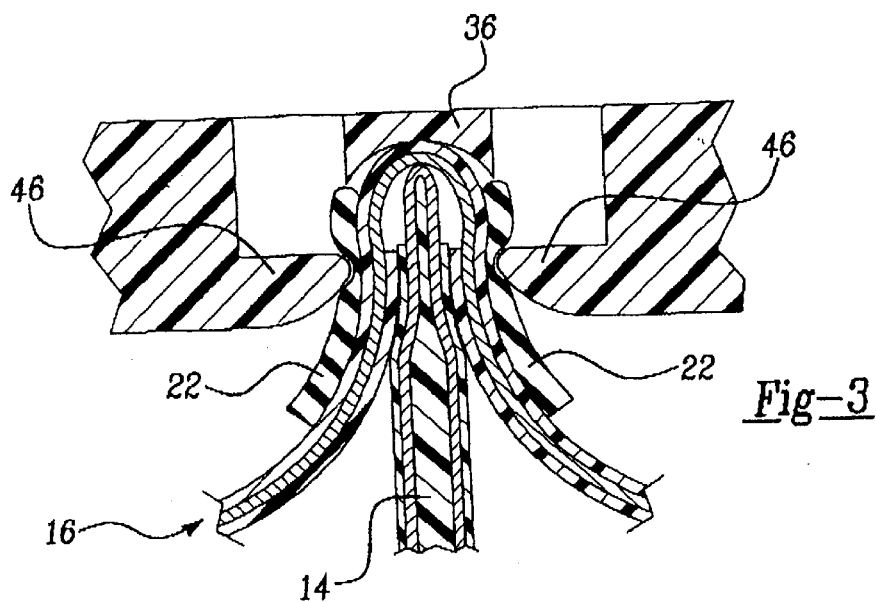
FIG. 3 is a top, sectional and assembled view of a portion of the assembly shown in FIG. 1.
Figure 4:
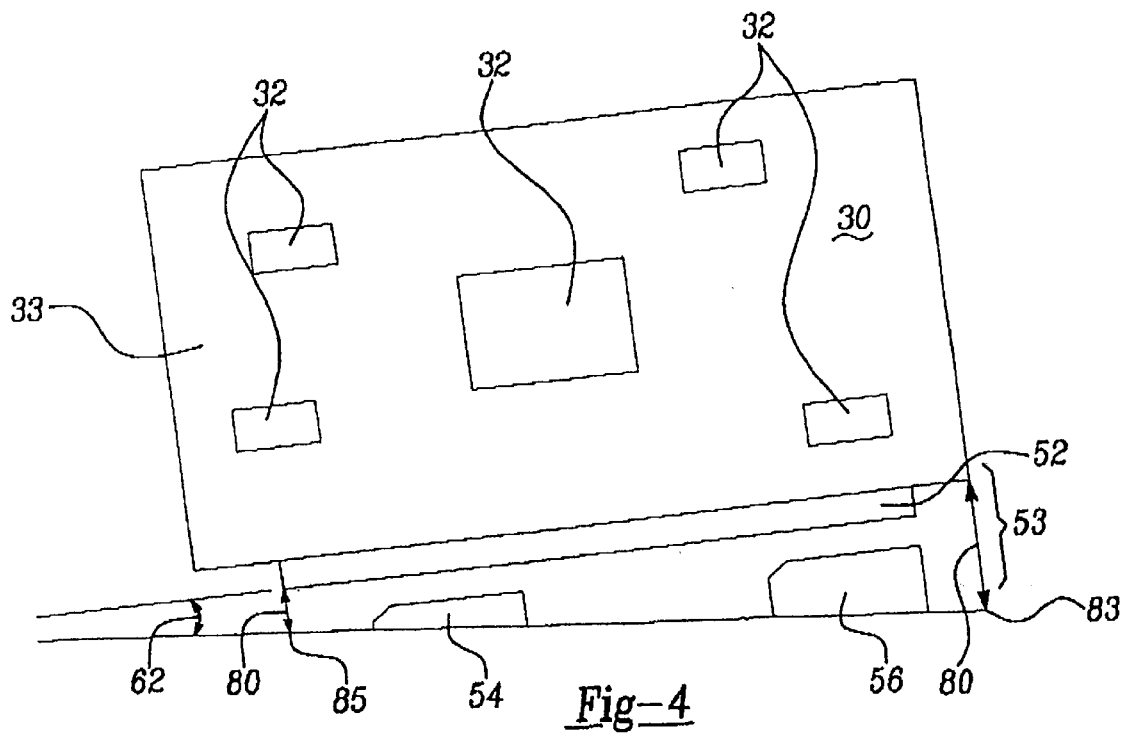
FIG. 4 is a side view of the circuit card assembly shown in FIG. 1.
Figure 5:
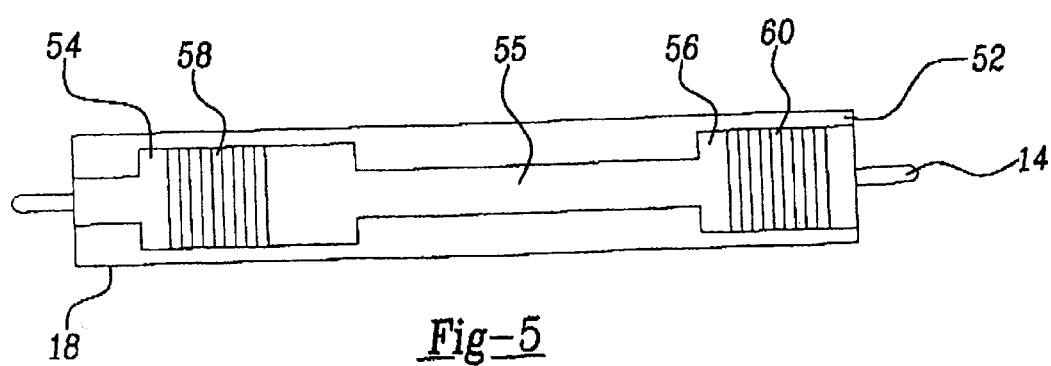
FIG. 5 is a bottom view of the circuit card assembly shown in FIG. 4.

Referring now to FIGS. 1–3, there is shown an electrical connector assembly 10 made in accordance with the teachings of the preferred embodiment of the invention. As shown, electrical connector assembly 10 includes a generally flat and rectangular flexible circuit 30 having a planar surface formed by a dielectric substrate 18 upon which several electrically conductive busses 34 and interconnected components 32 reside. Particularly, substrate 18 comprises a commercially available polyester material, commonly known as "PET" or "PEN," which is provided by Sheldahl Corporation.

Flexible circuit 30 substantially encircles card 14 and is mountably supported upon card 14 by a conventional direct intrusion methodology, by the metalization of card 14, or by use of a conventional and commercially available adhesive material. Busses 34 also selectively encircle card 14 and are formed from electrically conductive materials, such as copper. Moreover, busses 34 and the connecting interface between busses 34 and the components 32 are normally and protectively covered by a transparent protective cover or "solder mask" 43.

The interconnected components 32 cooperatively and electronically control various portions of the automobile, such as those portions resident within an instrument panel or "dashboard", and communicate control signals to these controlled portions and to other automobile components by the use of busses 34. Components 32 also selectively receive signals by use of these busses 34 and cooperatively form a single electronic circuit control module. Each of these modules may each be mounted upon a card 14 and selectively and communicatively secured within assembly 10, thereby allowing for relatively secure and efficient communication by and between these assembled modules and by and between these modules and other selected components and modules of the automobile.

Typically, card 14 is fabricated from a relatively rigid material such as, but not limited to, conventional and commercially available plastic material. In another embodiment, card 14 is manufactured from a relatively efficient thermally conductive material, such as aluminum, and operationally forms a heat sink which dissipates the heat generated by the various mounted components 32 and busses 34. Card 14 further includes an integrally formed support and guide member 53 having substantially identical top "L" shaped wing portions 52 which are each substantially and longitudinally co-extensive to circuit 30, which are deployed on opposite sides of card 14, and which extend from card 14 in opposite directions. Card 14 also includes a protruding and generally "dumbbell" shaped bottom surface 55 forming generally rectangular "key portions" 54 and 56 formed on opposed ends of a thin middle portion.

Figure 6:
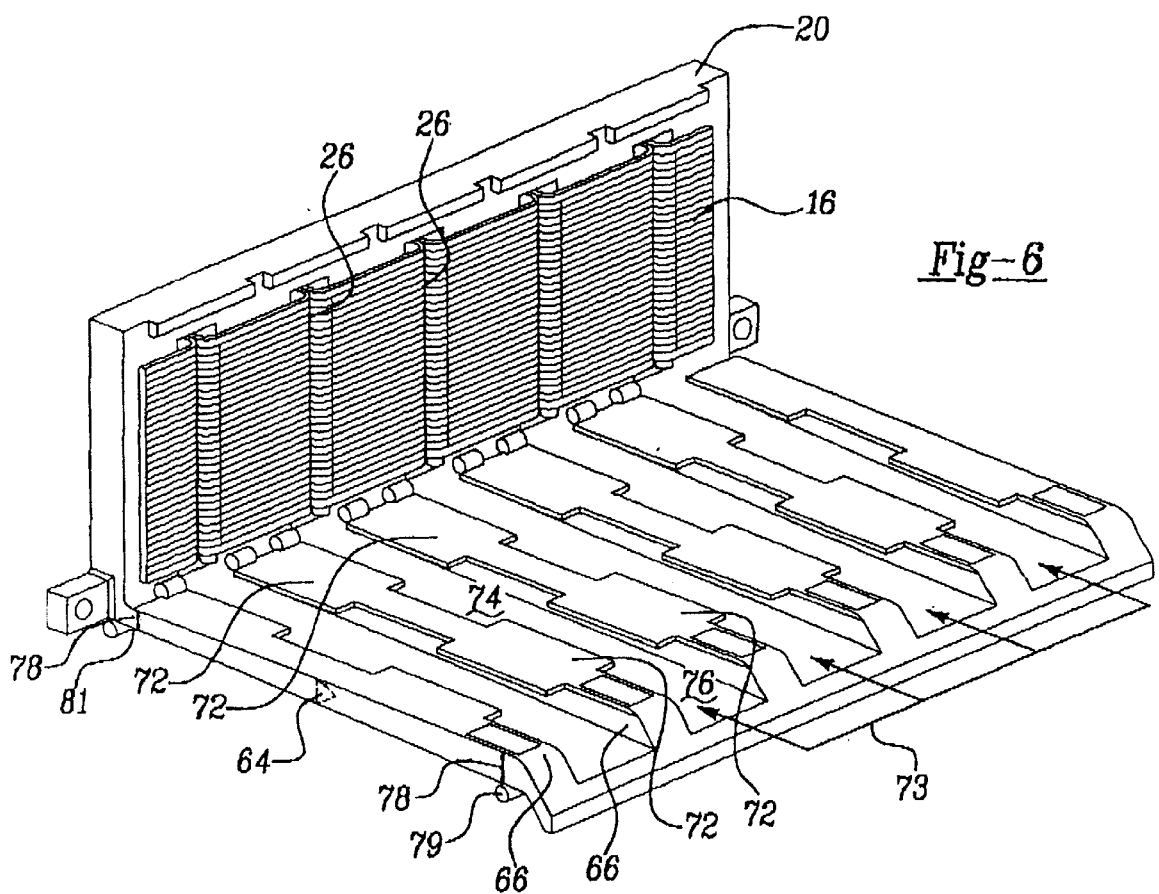
FIG. 6 is a perspective view of the card reception assembly shown in FIG. 1.
Figure 7:
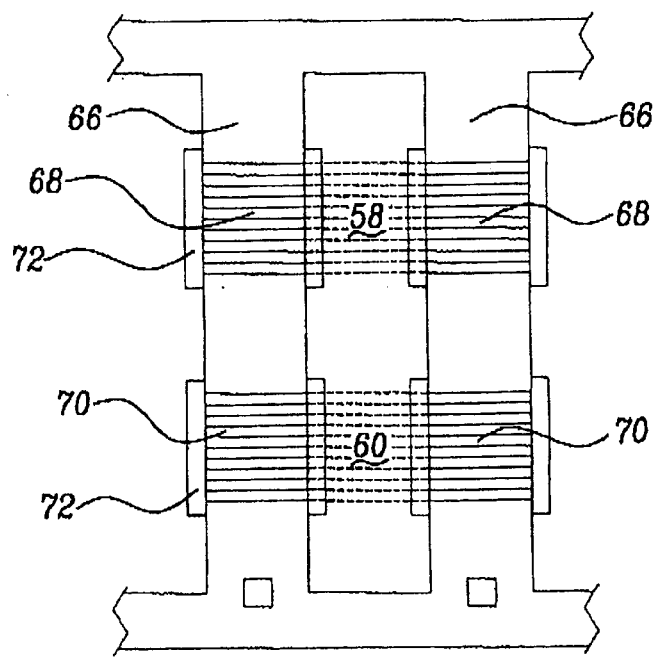
FIG. 7 is a bottom view of the card reception assembly shown in FIGS. 1 and 6.
Figure 8:
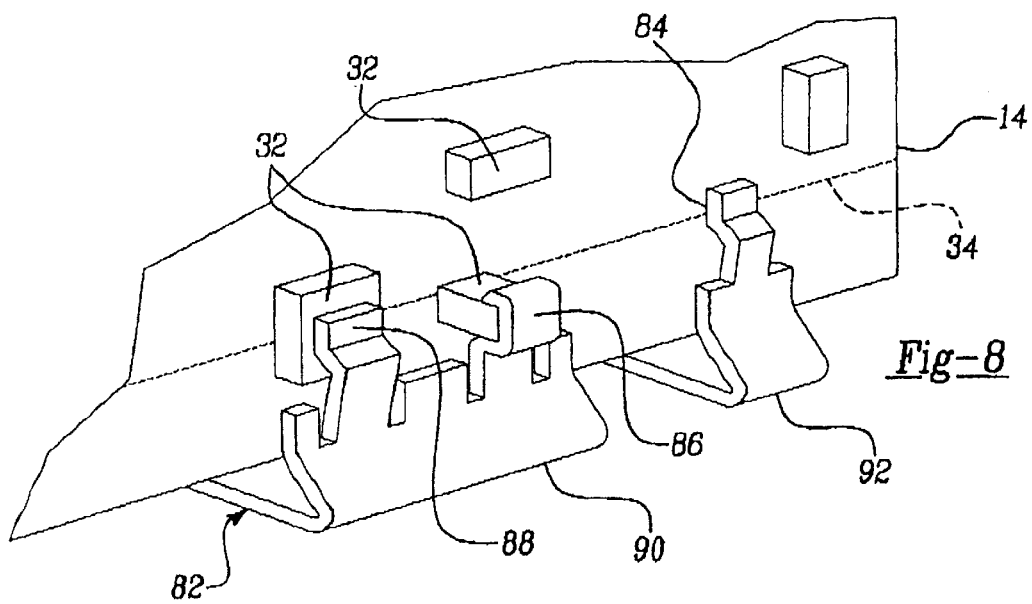
FIG. 8 is a perspective fragmented view of a steel spring guide for use with a card assembly of the present invention.

As best shown in FIGS. 1 and 6, assembly 10 further includes a base or card reception assembly 24 including several card reception channels 73 which are each cooperatively formed by a unique pair of adjacent rails 66. Base 24 further includes an integrally formed backplane 20 having a generally planar surface 21 which is orthogonally positioned relative to the rails 66 and which contains several substantially identical slotted apertures 26. Particularly, each of the apertures 26 is proximately positioned relative to and has a longitudinal axis of symmetry which is substantially perpendicular to a unique one of the channels 73. In one embodiment, each slotted aperture 26 is formed by a pair of substantially identical "force plates" or ridges 46 (shown best in FIGS. 2–3) which are integrally and depressibly formed within backplane 20 and which cooperate with a generally concave support buttress 36, also integrally formed within backplane 20, to create a generally "omega shaped" cavity 38.

Flexible circuit 16, which may selectively traverse through and connect to various portions, components, and/or modules of an automobile, is selectively, removably, and insertably positioned within cavity 38 and includes several electrical busses 40 which are substantially encased within a transparent protective cover 42. Particularly, these busses 40 are deployed upon a dielectric substrate 18 and, upon the selective insertion of card 14 within the cavity 38, cooperatively and selectively communicate electrical signals (e.g., power, ground, and/or electrical control signals) to and from the various busses 34 of card 14, thereby allowing these signals to be selectively communicated to the various modules contained within the assembly 10 and/or other modules or components within the automobile and allowing an automobile electrical interconnection network to be relatively efficiently created.

As shown best in FIGS. 2, 3, and 6, in operation, guide member 53 of each card 14 is movably disposed within a unique one of the channels 73. In order to allow assembly 24 to be placed within a wide variety of mounting spaces within an automobile, assembly 24 is adapted to allow card 14 to be selectively placed above or over one of the channels 73 and to thereafter be inserted into the channel 73, or alternatively, to be directly inserted into one of the channels 73 at the open ends of the channel. According to the first insertion arrangement, key portions 54, 56 are respectively aligned with a unique one of the notched openings 74, 76 which are cooperatively formed by rails 66 and the substantially planar rail tabs 72. Card 14 is lowered within the channel 73 until each of the wing portions 52 slidably engage the top surface of a unique one of the opposing rails 66. As card 14 is slid or moved toward backplane 20, rail tabs 72 are received within the channels 77 formed by wing portions 52 and key portions 54, 56 further movably securing the card within the channel 73. Alternatively, according to the second arrangement, surface 55 is slidably inserted into the open end of channels 73, thereby allowing support wing portions 52 to slidably engage the top surface of rails 66 and allowing rail tabs 72 to be received within the channels 77.

Guide member 53 and a channel 73 therefore cooperatively allow a card 14 to be moved from a first "backplane remote" position to a second backplane contacting position in which card 14 engages "stop" members 71 and in which interface portion 35 of circuit 30 enters aperture 26 and cavity 38, thereby allowing conductive buss 34 of circuit 30 to physically, selectively, removably and electrically contact conductive buss 40 of flexible circuit 16. In this manner, busses 34 and 40 communicate, thereby allowing power, ground, or other types of electrical control signals to be selectively transferred by and between the mating busses 34, 40 and to the various other components and/or modules which communicate with and are connected to these busses 34, 40. The mating of busses 34, 40 within assembly 24 will now be discussed. Circuit 16 is initially compressed to form a cup-shaped portion with an interior circuit reception slot 44 having a shape substantially identical to interface portion 35, and an exterior surface containing a pair of substantially identical elastomeric members 22 which each include substantially identical concave ridges 50. Members 22 and ridges 50, in one embodiment, are coextensive to width 17 of the circuit 16.

A portion of the protective cover 42 is removed from the surface of circuit 16, which forms the interior circuit reception slot 44, thereby exposing a portion of bus 40. A corresponding portion of the protective cover 43 is removed from circuit 30 in the vicinity of interface portion 35, thereby similarly exposing a small portion of bus 34. Card 14 is inserted into the reception slot 44, thereby allowing the exposed busses 34 and 40 to selectively and electrically mate or contact. As this mated circuit assembly is inserted into the aperture 26, each member 22 compressibly engages against a unique one of the force plates 46 and enters the cavity 38. Particularly, as circuit 16 is received within the concave compression surface 48 of buttress member 26, each of the ridges 50 receives a unique one of the plates 46, thereby securing the mated busses 34, 40 within the cavity 38. To further secure this mating connection, several ridges 37 are integrally formed within buttress 36. Particularly, each ridge 37 is of substantially the same size and shape as a unique one of the busses 40 and each ridge 37 compressibly receives a unique mating bus pair 34, 40, thereby ensuring continued electrical mating contact between these busses. Alternatively, cupped circuit 16 may initially be inserted within cavity 38 with card 14 being later inserted.

In a separate embodiment, members 22 are replaced by elastomeric members which are each attached to a unique one of each of the force plates 46 and which cooperatively provide a mating force between card 14 and the inserted flexible circuit 16. In yet another embodiment, a strip of commercially available gelatin is placed between interface portion 35 of card 14 and the reception slot 44. As card 14 is forcibly inserted into the cavity 38, the gelatin deforms, thereby providing a seal between the connections of busses 40 and 34 and a compression force which further secures the connection between card 14 and flexible circuit 16.

Figure 18:
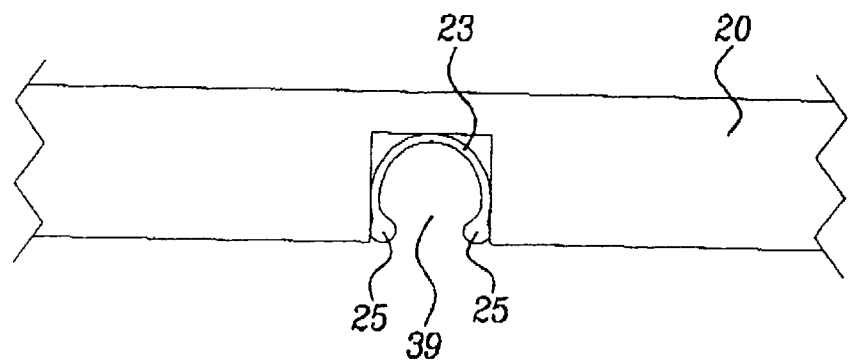
FIG. 18 is a top fragmented sectional view of an alternate embodiment of the connector assembly shown in FIG. 1.

Referring now to FIG. 18, in yet another embodiment, backplane 20 includes at least one substantially rectangularly shaped cavity 39 which selectively receives a generally omega-shaped removable elastomeric "boot" member 23 having a pair of substantially identical resiliently rounded engagement portions 25 which cooperatively and frictionally secure card 14 and flexible circuit 16 in cavity 39, thereby allowing mating portions of busses 34, 40 to be secured within the cavity 39. It should be understood that omega-shaped boot member 23 may also be used in conjunction with cavities having other types of cross-sectional areas, such as a "U"-shaped cross-section, a semi-circular cross-section, or a hyperbolic cross-section. Removable boot member 23 may also include integrally formed force plates substantially identical to force plates 46 and a buttress substantially identical to buttress 36, thereby providing an omega-shaped cavity substantially identical to cavity 38, or any other desired shape.

As best shown in FIGS. 4 through 7 and 19, circuit 30 may be selectively coupled to conductive terminal plates 58, 60 which are selectively and electrically connected to conductive bus 34, which are respectively disposed upon key portions 54, 56, and which are formed by electrically conductive materials, such as copper. The bottom surface of rails 66 (opposite the surface having tabs 72) includes conductive portions 68, 70 which are adapted to respectively and uniquely interconnect with terminals 58, 60 when card 14 is filly inserted into base 24 and which may further be selectively connected to different portions of flexible circuit 16 or to various other automobile circuits or components. Hence, selectively interconnected members 58 and 60, and selectively interconnected members 68 and 70 cooperatively connect selective portions of circuit 30 and/or various components 32 to selective portions of flexible circuit 16 or to other circuits, busses, components, or modules which may be communicatively and electrically coupled to circuit 16.

Figure 19:
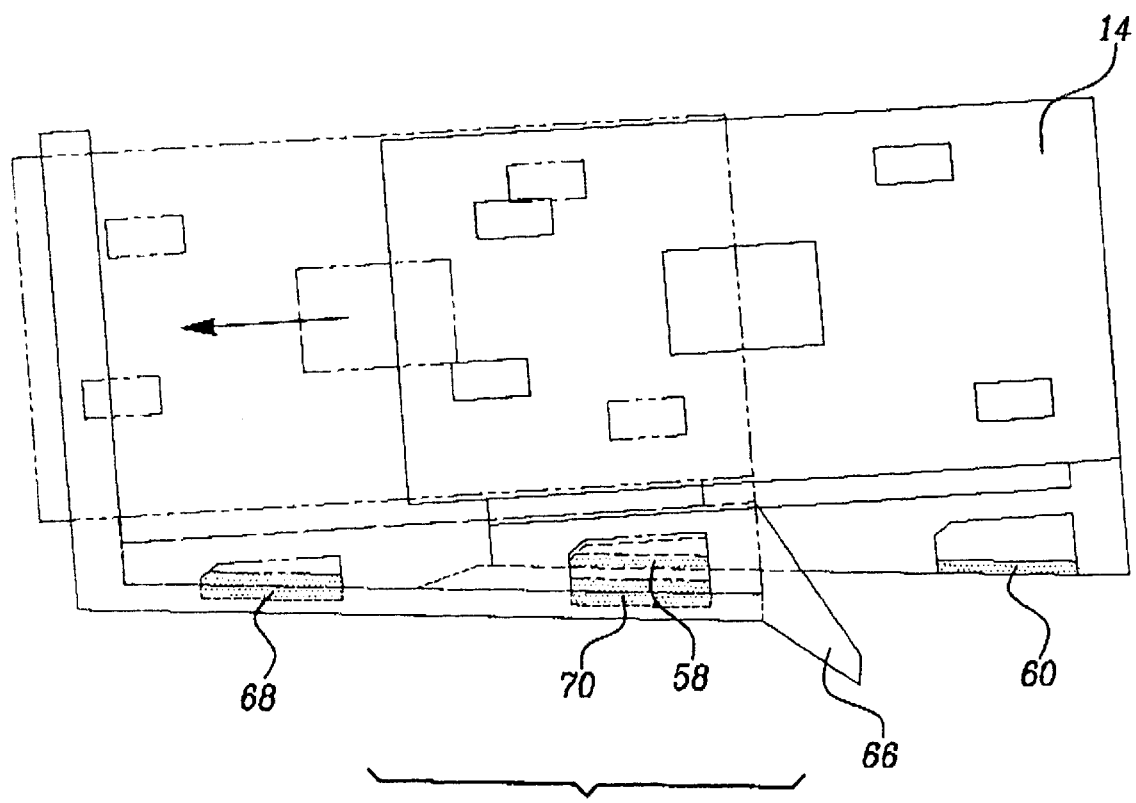
FIG. 19 is an illustration of the selective deployment of a card into the circuit card reception assembly shown in FIGS. 1 and 6.

In one embodiment, base 24 and card 14 are adapted so that substantially no electrical connection is made or created between any portion of connecting terminals 68, 70 and between any portion of connecting terminals 58, 60 until card 14 is fully and completely inserted into base 24 (i.e., until the card 14 is inserted into and secured within slotted aperture 26). This is achieved by angularly "tapering" rails 66 (i.e., by gradually decreasing the thickness 78 of rails 66 along their respective length of the rails 66 between a point 79, remote from backplane 20, to a point 81 which is relatively close to backplane 20), and concomitantly angularly "tapering" guide member 53 (i.e., by gradually decreasing the width 80 of member 53 between a point 83 remote from the interface portion 35 of card 14 to a point 85 relatively close to portion 35). The rates at which thickness 78 and distance 80 are decreased or tapered are substantially similar and cause angles 64 and 62 to each be approximately five degrees. Hence, the conductive terminals 58, 60 will not engage respective conductive members 68, 70 until card 14 is fully inserted into base 24. Moreover, as best illustrated in FIG. 19, no electrical and physical connection is created between terminals 58 and 70 and between conductors 60 and 68, thereby preventing communication and continuity between the various components, modules, and/or busses connected to terminals 58 and 70 and those connected to terminals 60 and 68.

In a separate embodiment of the present invention, member 53 is replaced by a pair of substantially identical resilient spring steel guides 82, each of which is disposed upon a unique one of the side surfaces of card 14 and each of which may be integrally formed with card 14 or removably coupled to card 14. Particularly, guide 82 includes a resilient base 90 including a generally "C"-shaped resilient clamping portion 86 which selectively and receivably engages one of components 32 and further including a resilient "finger" portion 88 which engages a second of the components 32. Portions 86 and 88 cooperatively secure the components 32 onto card 14 and provide a thermally conductive path between each of the secured components 32 to base assembly 24, thereby dissipating heat which is generated by the clamped components 32.

Guide 82 also includes a second extended resilient member 92 having flexible electrically conductive portion 84 which electrically, physically and selectively is connected to bus 34 and/or to component 32 of circuit 30 thereby selectively connecting circuit 30 to base 24. More particularly, portion 84 is electrically connected to circuit 30.

In card insertion operation, members 90, 92 are selectively and respectively aligned with openings 74, 76 and are movably inserted within a channel 73, thereby allowing portion 84 to selectively contact terminals 68, 70. Opposed rails 66 frictionally engage members 90, 92, thereby allowing assembly 82 to be slidably retained within the channel 73.

In another embodiment, a dielectric material is selectively applied to the component/circuit contacting surfaces of portions 84, 86 and 88, thereby allowing guide 82 to thermally dissipate heat generated by any of components 32 or circuit 30 while preventing the creation of electrical continuity between the guide 82 and the component 32.

Prior terminal shroud connector assemblies, such as connector assembly 120 shown in FIG. 11, include a housing 121 having a circuit insertion slot 122 which selectively receives a portion of flexible circuit 102 and which allows the received circuit 102 to be selectively mated to a variety of contained connectors. Assembly 120 further includes a second reception slotted aperture 123 which selectively receives a second flexible circuit and/or connector and which selectively mates the contained circuit 102 to the received second flexible circuit or circuit connector. While these prior connectors adequately allowed these received circuits to mate, they suffered from some drawbacks.

In operation, flexible circuit 102 is typically compressed against planar surface 114 of connector 120 and more particularly, against the relatively sharp edge 115, thereby "crimping" the circuit 102 and causing the bending radius 118 of flexible circuit 102 to be very small. This "crimping" causes a relatively sharp and undesirable crease 116 to be formed within flexible circuit 102 which damages the circuit 102 and which causes the circuit 102 to malfunction.

Figure 9:
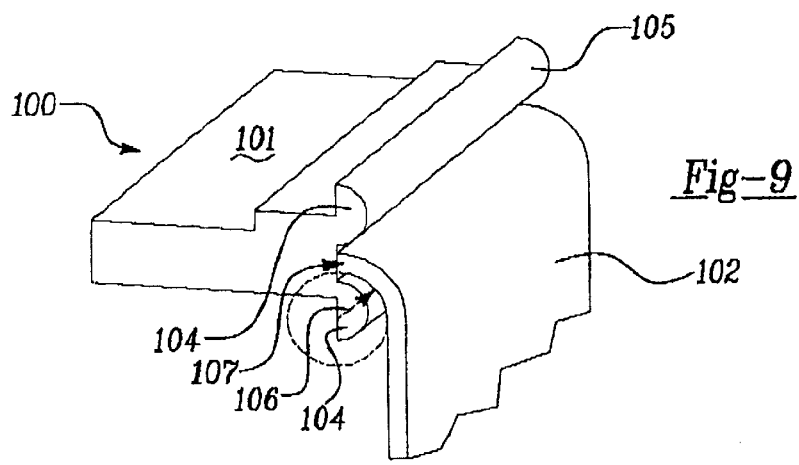
FIG. 9 is a perspective view of a terminal shroud connector made in accordance with the teachings of the present invention.

In contrast to the flat mating surface 114 and sharp edge 115 of the prior shroud connector 120, connector 100, shown in FIG. 9, includes a pair of substantially semi-cylindrical "bending radius control" portions, formed within housing 101 and disposed on opposed sides of the circuit reception aperture 107. As shown, when flexible circuit 102 is inserted within aperture 107 and thereafter pressed against either of the mating surfaces 105, a relatively large circuit-bending radius 106 is formed, thereby substantially preventing the formation of crease 116 and substantially preventing damage to the flexible circuit 102.

Figure 10:
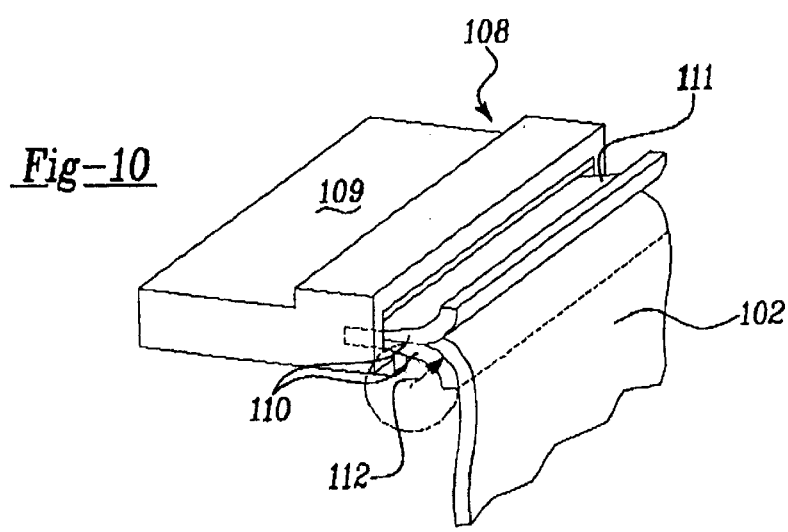
FIG. 10 is a perspective view of a terminal shroud connector made in accordance with the teachings of an alternate embodiment of the present invention.

FIG. 10 illustrates a second embodiment of a terminal shroud connector 108. Particularly, connector 108 includes a housing 109 having a pair of substantially similar arcuately shaped and flexible members 110 which are removably inserted within the circuit reception aperture and which cooperatively provide a relatively smoothly flared circuit bending surface which cause circuit 102 to form a relatively large circuit bending radius 112, thereby preventing crease 116 to be formed.

In one embodiment of the present invention, members 110 are manufactured from a soft plastic material and are attached to a portion of the opposed side surfaces of circuit 102 prior to its insertion into reception slot 111 of terminal shroud connector 108. In other embodiments, members 110 are formed from an elastomer and are selectively inserted into shroud connector 108 after flexible circuit 102 is inserted into housing 109.

Referring now to FIGS. 12 and 13, there is shown another connector assembly 200 which is made in accordance with an alternate embodiment of the invention and which is adapted to allow conductive busses 206, 208 of flexible circuits 202 and 204 to be selectively connected. Particularly, assembly 200 includes a substantially cylindrical (i.e., "dowel shaped") elastomeric core member 214 having a radius 226, and a generally "C" shaped or semi-cylindrical clamping member 216 having a radius of curvature 228 substantially identical to radius 226, a pair of integrally formed and linearly co-extensive raised retention edges 218, 220, and forming a retention groove or slot 224. In one embodiment of the invention, core 214 is formed from conventional and commercially available plastic material. In another embodiment, core 214 is manufactured from a metallic heat conducting substance and operates as a heat sink to dissipate heat from the electrical interface of circuits 202 and 204.

Circuits 202 and 204 having respective dielectric surfaces 210 and 212, are bent and mated, thereby allowing a physical and electrical connection to be made to exposed portions of conductive busses 206, 208 and causing the circuits to cooperatively form a generally "C" shaped or semi-cylindrical reception slot 222 which receives core 214. The assembled core 214 and mated circuits 208, 210 are forcibly inserted into slot 224. Edges 218, 220 frictionally engage and retain the received core 214 and the mated circuits 202, 204 within the slot 224, thereby ensuring the continued integrity of the mated circuit connection.

In another embodiment, edge members 218, 220 are outwardly extended along surface 212, thereby increasing the surface area of slot 224 while providing a more secure interconnection between circuits 202, 204. Further, it should also be understood that connector 200 can also be selectively employed as part of many diverse types of connection assemblies, such as connector assembly 10. For example, connector 200 may be selectively inserted and reside within one of apertures 26 of assembly 10.

Figure 14:
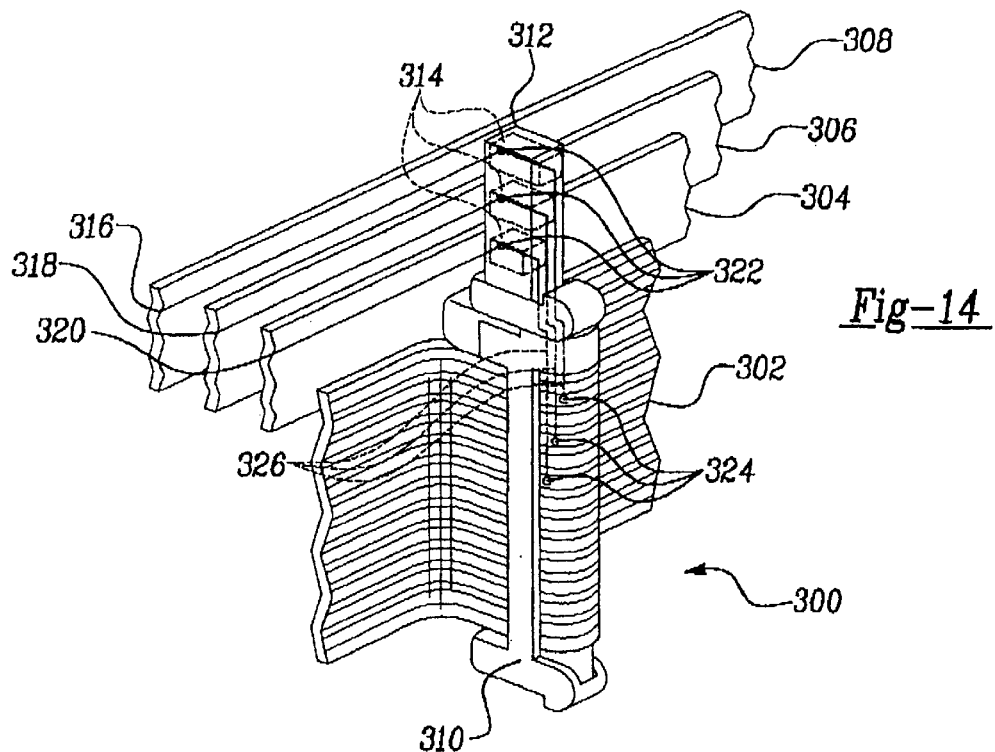
FIG. 14 is a perspective fragmented view of a connector assembly made in accordance with the teachings of yet another alternate embodiment of the present invention.

Referring now to FIG. 14, there is shown connector assembly 300 which selectively connects flexible circuit 302 to one or more other flexible circuits 304–308. Particularly, connector 300 includes a generally hollow clip member 310 which selectively receives flexible circuit 302 and, as shown below, allows circuit interconnections to be rather easily made. Particularly, member 310 includes a multi-terminal connector 312 having several electrically conductive terminals 314 which are respectively, electrically, physically and selectively connected to conductors 316, 318, 320 of circuits 308, 306, and 304 at points 322. These connections may be made by soldering or by other known methods. Each of the terminals 314 are further respectively, electrically, physically and selectively connected to a unique one of the conductors 324 of flexible circuit 302 by use of conductive paths 326 residing within connector 312. Alternatively, circuit 302 resides upon the outside surface of connector 310 and terminals 322 are electrically connected to conductive portions which terminate and appear upon the outside surface of assembly 310. Connections to circuit 302 may be selectively made by the movement of clip 310 to a desired circuit.

Figure 15:
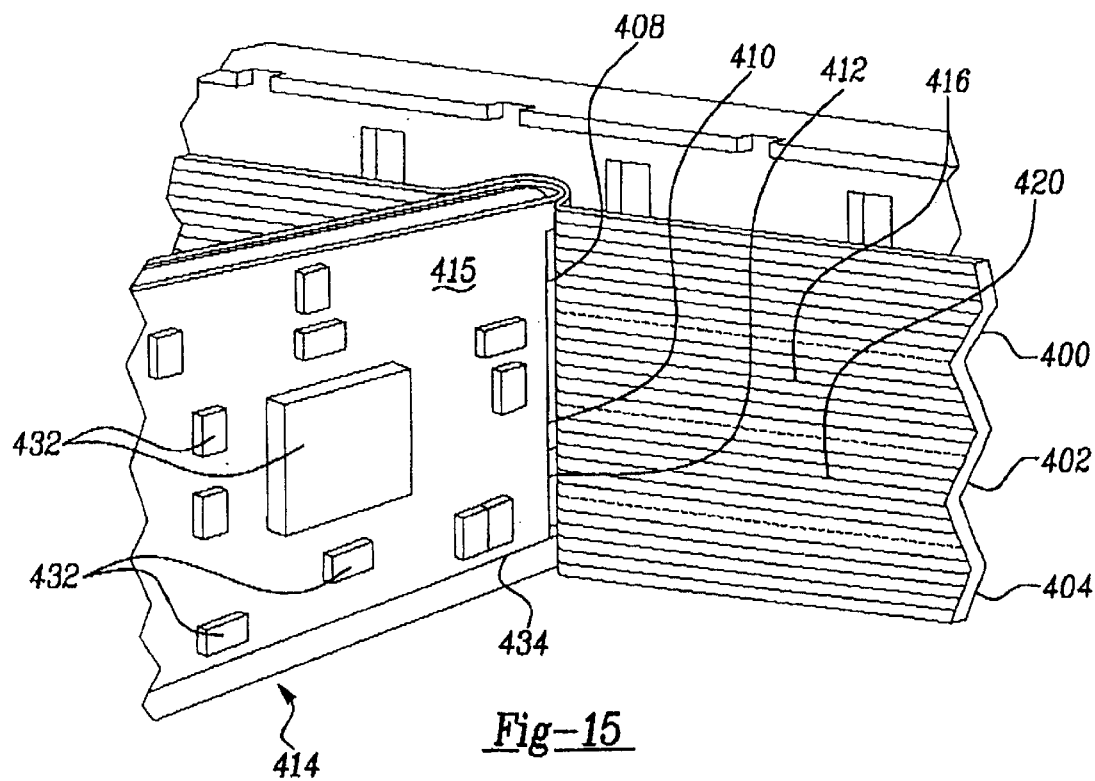
FIG. 15 is a perspective fragmented view of a flexible circuit arrangement used in combination with a circuit card assembly of the invention.

FIG. 15 illustrates yet another circuit connection embodiment which is adapted to selectively connect several flexible circuits, such as circuits 400, 402, 404, to a circuit 415 (i.e., such as circuit 30) mounted upon a card 414 (i.e., such as card 14) and including various components 432 and busses 434. In this arrangement, flexible circuits 400–404 are positionally and spatially offset so that respective conductive busses 434 on circuit portions 408, 410, 412 are each selectively and respectively connected to various selected portions of circuit 415. Particularly, by positionally and spatially displacing the various flexible circuits 400–404, selected portions of circuit 415 are selectively connected in a desired manner to these circuits 400–404 as card 414 engages the circuits 400–404. It should be understood that circuits 400–404 may be contained within the same substrate or may each be individually contained within a separate substrate.

Figure 16:
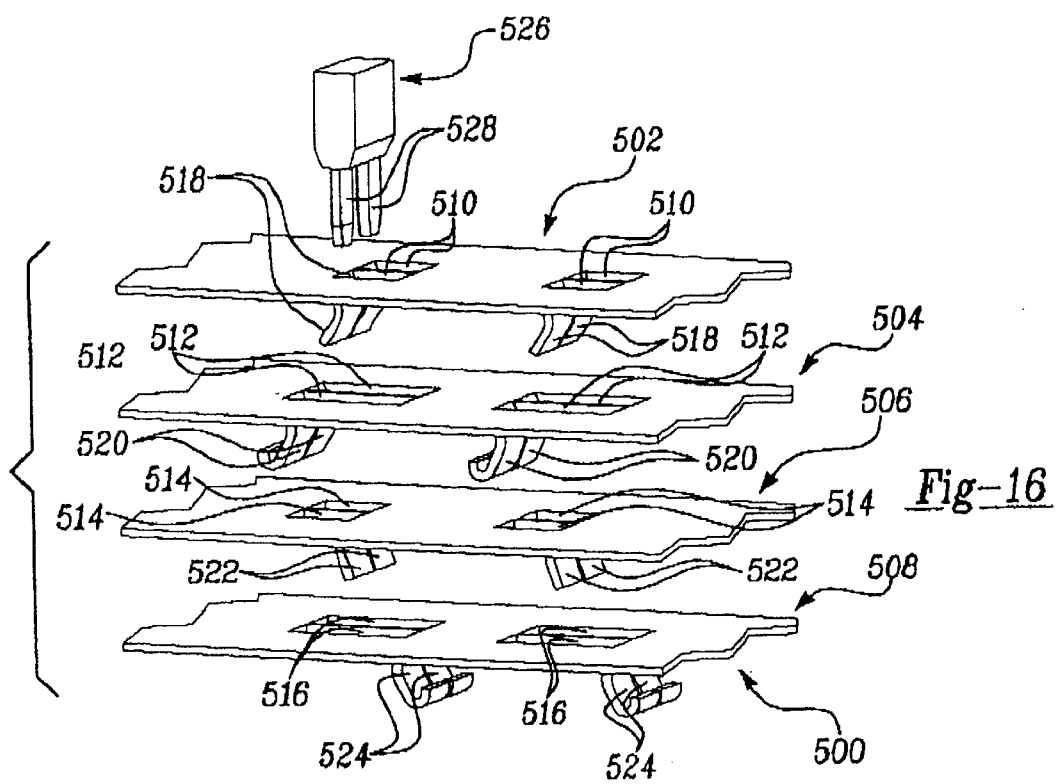
FIG. 16 is a perspective fragmented unassembled view of a heat sink assembly made in accordance with the teachings of the present invention.
Figure 17:
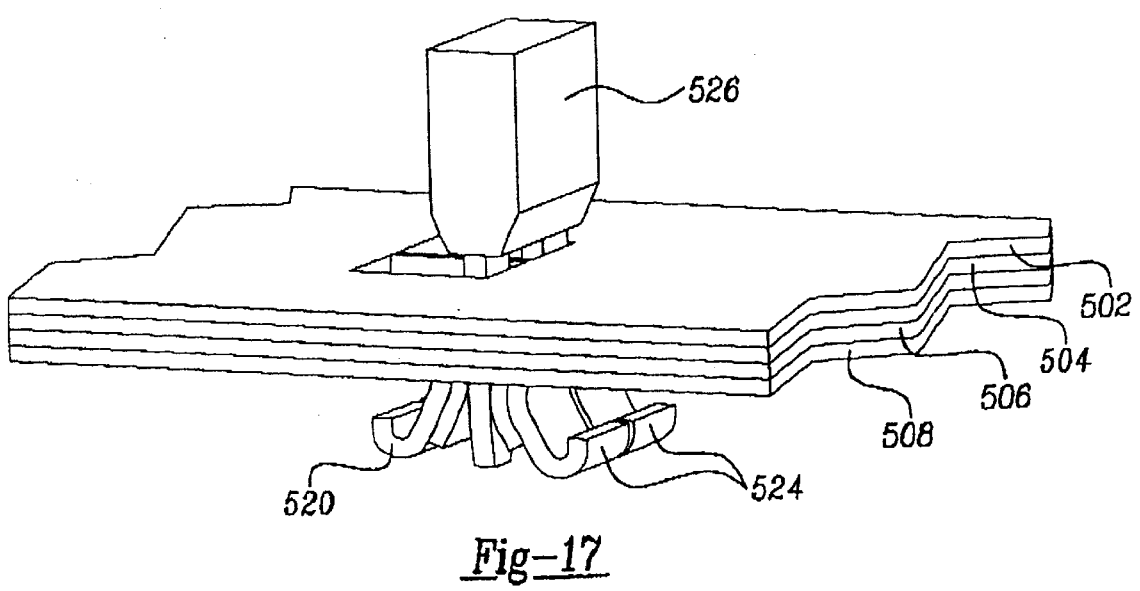
FIG. 17 is a perspective assembled view of the heat sink assembly shown in FIG. 16.

Referring now to FIGS. 16–17, there is shown a heat sink assembly 500 for use with a flexible circuit 502 and which selectively and operatively dissipates heat from the portion of circuit 502 which is selectively coupled to a fuse 526 or other contained circuit component 32.

As shown, assembly 500 includes upper and lower substantially identical and generally planar spring layers 504, 508, and a dielectric layer 506. Particularly, layers 504 and 508 are formed or constructed from a thermally and/or electrically conductive material, such as copper, while layer 506 is constructed or formed from plastic or some other conventional and commercially available dielectric material. Layers 504–506 each have substantially identical and respective rectangular apertures 512, 514 and 516 which are formed in pairs. Particularly, each pair of apertures 512–516 is respectively aligned with a unique pair of apertures 510 contained within flexible circuit 502. A resilient, arcuate, downwardly extending, and electrically conductive flange 518 is formed at one edge of each aperture 510, and a substantially identical shaped flange 522 is formed at one edge of each aperture 522. A resilient, substantially "J" shaped, downwardly extending, and thermally conductive flange member is formed at one edge of each aperture 512, 516.

After the apertures 510–514 are initially aligned, circuit 502 is removably placed onto the assembled layers 504–508, as shown in FIG. 17 and each flange 518 traverses through a unique aligned aperture 512, 514, and 516, and each flange 522 extends through a unique aperture 516. Finally, each member 520 extends through a unique alignment of apertures 514, 516, thereby forming the assembly shown in FIG. 17. Fuse 526 is selectively inserted through apertures 510 and the heat that is generated from circuit 502 is dissipated through spring layers 504, 508 and the contacting members 518, 520, 522, and 524.

In another embodiment, dielectric layer 506 is replaced with a second flexible circuit and spring layer 504 is manufactured from an electrically conductive material and is used to interconnect one or more busses of circuit 502 to one or more busses of the second flexible circuit. In this embodiment, portions of spring layer 504 are selectively coated with a dielectric layer so that only selective portions or busses of circuit 502 and the second circuit are electrically connected.

It should be understood that this invention is not limited to the exact construction or embodiments listed and described, but that various changes may be made without departing from the spirit and scope of the invention.

What is claimed is:

1. An electrical connector assembly comprising:
   a base having a plurality of rails and a backplane, said backplane having a cavity cooperatively formed by a pair of force plates and a support buttress;
   a first flexible circuit disposed upon said backplane and having a first conductive buss;
   an elastomeric member disposed upon said first flexible circuit; and
   a card containing a second flexible circuit having a second conductive buss, said card being movably disposed upon a first and a second of said plurality of rails and movable between a first position remote from said cavity and a second cavity penetrating and buttress contacting position in which said card penetrates said cavity, thereby causing said elastomeric member to deformably engage said force plates and securely and electrically connecting said first conductive buss to said second conductive buss within said support buttress.

2. The electrical connector assembly of claim 1 wherein said elastomeric member further comprises two opposing ridges which each receive a unique one of said force plates.

3. The electrical connector assembly of claim 1 wherein said first and said second busses are of substantially the same shape, said buttress including a ridge having a shape which is substantially similar to said shape of said busses and which compressibly receives said mated first and second busses.

4. The electrical connector assembly of claim 1 wherein said cavity is of a substantially omega shape.

5. The electrical connector assembly of claim 1 wherein said card includes a component, said assembly further comprising a spring guide member adapted to attach to said card and to said component and to frictionally and slidably engage said first and said second of said plurality of rails, thereby allowing said card to be movably disposed upon said first and said second of said plurality of rails.

6. An electrical connector assembly comprising:
   a base having a pair of rails which cooperatively form a reception channel, and further having a backplane including an integrally formed cavity which is cooperatively provided by a pair of force plates and a support buttress;
   a first flexible circuit disposed upon said backplane and including a first conductive buss;
   a pair of elastomeric members disposed upon said first flexible circuit and having a certain width, each of said pair of elastomeric members having a ridge which is coextensive to said certain width and which selectively mates with a unique one of said force plates; and
   a second flexible circuit having a second conductive buss and being mountably supported upon a card, said card having a guide member which is selectively and movably inserted within said reception channel and having a pair of substantially identical "L" shaped wing portions which each receive and which are movably disposed upon a unique one of said rails and which cooperatively allow said card to be moved between a first position remote from said cavity and a second position in which said card penetrates cavity, thereby causing said first and said second busses to matingly engage within said cavity and causing said pair of elastomeric members to deformably engage a unique one of said force plates, thereby causing each of said ridge portions to mate with a unique one of said force plates and to securely position said mated first and second busses within said cavity.

7. An electrical connector assembly comprising:
   a base having a reception channel formed by first and second tapered rails, each of said rails including a generally flat top surface and a bottom surface containing first and second electrically conductive terminals; and
   a card having a guide member which is selectively and movably disposed within said reception channel and which includes a pair of wing portions which extend from said guide member and which are each slidably disposed upon the generally flat top surface of a unique one of said rails, and which further includes a bottom portion having third and fourth conductive terminals which selectively and respectively couple to said first and second electrically conductive terminals of said base as said card is moved within said reception channel.

8. The connector assembly of claim 7 wherein said card mountably supports a circuit and wherein said first and said second electrically conductive terminals are connected to said circuit.

9. An electrical connector assembly for use in combination with a first and a second circuit, each having at least one buss, said assembly comprising:

a substantially semi-cylindrical circuit reception member having a groove portion which selectively receives said first and said second circuits and a pair of integrally formed and linearly coextensive raised retention ridges; and a cylindrical core member which conformingly and frictionally fits within said groove portion thereby, selectively engaging said first and said second circuits and allowing said at least one buss of each of said first and second circuits to matingly engage within said groove portion.

10. The electrical connector assembly of claim 9, wherein said core is composed of an elastomeric material.

11. The electrical connector assembly of claim 9, wherein said core is composed of a metallic heat conducting material.

12. A heat sink assembly for use with an electrical component having first and second terminals, said heat sink assembly comprising:

a flexible circuit containing said component;

first and second conductive spring layers which receive said first and second terminals of said component; and a dielectric layer disposed between said first and said second spring layers, which receives said first and second terminals of said component and which cooperates with said first and second conductive spring layers to dissipate heat generated by said component.

13. A method for making an electrical connection between a first flexible circuit and a second flexible circuit, said method comprising the steps of:

providing a base assembly having at least one channel formed by an opposing pair of rails, and a backplane having a cavity perpendicularly disposed to said rails;

inserting an elastomeric member within said cavity;

disposing said second flexible circuit upon said backplane and within said cavity;

providing a card;

mounting said first flexible circuit upon said card; and movably disposing said card within said rails between first position which is remote from said cavity and a second position in which said card penetrates said cavity thereby deforming said elastomeric member and securely and electrically connecting said first circuit to said second circuit.

* * * * *